(12) United States Patent
Namose

(10) Patent No.: US 6,821,380 B2
(45) Date of Patent: Nov. 23, 2004

(54) TEMPERATURE ADJUSTMENT APPARATUS

(75) Inventor: Isamu Namose, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 09/858,859

(22) Filed: May 16, 2001

(65) Prior Publication Data

US 2002/0020189 A1 Feb. 21, 2002

(30) Foreign Application Priority Data

May 17, 2000 (JP) .................................. 2000-145337

(51) Int. Cl.$^7$ .......................... H01L 21/00; C23C 16/00
(52) U.S. Cl. ................. 156/345.53; 118/724; 118/728; 118/500; 165/108; 165/278; 165/301; 165/104.33
(58) Field of Search ............................... 118/715–733; 156/345.1–345.53

(56) References Cited

U.S. PATENT DOCUMENTS

| | | | | |
|---|---|---|---|---|
| 4,518,009 A | * | 5/1985 | Schiemann | 137/571 |
| 4,677,943 A | * | 7/1987 | Skinner | 123/41.27 |
| 5,102,631 A | * | 4/1992 | Jordan et al. | 422/42 |
| 5,519,901 A | * | 5/1996 | Friedman | 4/503 |
| 5,572,883 A | * | 11/1996 | Roberts | 165/110 |
| 5,904,780 A | * | 5/1999 | Tomoyasu | 118/723 AN |
| 5,948,283 A | * | 9/1999 | Grosshart | 216/67 |
| 6,032,724 A | * | 3/2000 | Hatta | 165/80.2 |
| 6,101,316 A | * | 8/2000 | Nagashima et al. | 118/723 VE |
| 6,131,771 A | * | 10/2000 | Hanna | 222/136 |
| 6,174,408 B1 | * | 1/2001 | Kadomura et al. | 118/723 R |
| 6,383,257 B1 | * | 5/2002 | McDermott et al. | 62/616 |

FOREIGN PATENT DOCUMENTS

| | | | | |
|---|---|---|---|---|
| JP | 59190294 A | * | 10/1984 | C30B/19/00 |
| JP | 02303583 A | * | 12/1990 | B08B/03/08 |

OTHER PUBLICATIONS

Webster's New World Dictionary Third College Edition p. 1141.*

* cited by examiner

Primary Examiner—P. Hassanzadel
Assistant Examiner—Ram N. Kackar
(74) Attorney, Agent, or Firm—Harness, Dickey & Pierce, P.L.C.

(57) ABSTRACT

A temperature adjustment apparatus that can reduce the amount of evaporation of a medium without using a closed type container. A temperature adjustment apparatus 24 is composed of a container 26 that contains PFC 42 for heat exchange, a circulation path 28 of the PFC 42 that passes through an electrode 20 of a plasma processing apparatus 10, and a pump 30. A liquid layer 40 that separates from the PFC 42 is formed in an upper layer of the PFC 42 that is contained in the container 26. As a result, the PFC 42 does not directly contact the atmosphere and therefore the amount of evaporation of the PFC 42 into the atmosphere is substantially reduced.

18 Claims, 3 Drawing Sheets

24: Temperature adjustment apparatus
26: Container
28: Circulation path
40: Liquid layer
42: PFC (1)

(2)

TEMPERATURE ADJUSTMENT APPARATUS

TECHNICAL FIELD

The present invention relates to a temperature adjustment apparatus, and more particularly to a temperature adjustment apparatus equipped with a circulation path that passes through a subjected member wherein medium is passed through the circulation path to thereby conduct temperature setting.

BACKGROUND TECHNOLOGY

Conventionally, a method using a plasma apparatus is known for etching dielectric films (SiO2) or the like formed on the surfaces of semiconductor wafers.

In such a plasma apparatus, a pair of electrodes is provided in a chamber that is capable of reducing pressure therein. A high-frequency plasma generation apparatus is connected to one of the electrodes and a grounding potential is connected to the other electrode such that plasma can be generated between the electrodes. Gas to be used for etching is introduced into the chamber and at the same time plasma is generated between the electrodes to perform an etching on semiconductor wafers that have been disposed in advance between the electrodes.

It is noted that, in etching semiconductor wafers using a plasma apparatus, temperature control for the electrodes is an important factor in order to stabilize the etching. Therefore, in general, the electrodes are provided with a temperature adjustment apparatus in an attempt to keep the temperature of the electrodes constant. The temperature adjustment apparatus is composed of a container for containing a medium with a temperature adjustment system and a circular path that is led out from the container and passes through the electrodes. The medium whose temperature is adjusted to a specified level in the container is sent to the electrodes, to thereby set the temperature of the electrodes at a specified level. If a medium having a low insulation resistance value is used, the dielectric constant between the electrodes may vary. Therefore PFC in a liquid state having a large insulation resistance value is normally used as the medium. (Pure water has a large insulation resistance value in an initial state, but its resistance value lowers when metal dissolves in the pure water while being circulated.)

In the temperature adjustment apparatus described above, the container that contains the PFC is not a sealed type, but has a structure in which the liquid surface of the PFC is exposed to the atmosphere. As a result, in the apparatus, the PFC evaporates into the atmosphere, and therefore the PFC needs to be periodically supplemented. Furthermore, since the PFC has a high GWP (global warming potential) that is several ten thousands times higher than that of carbon dioxide, it is not environmentally preferable to be discharged into the atmosphere. For example, when $0.015 \text{ m}^3$ (15 litters) of PFC composed of $C_4F_{20}$ (its specific gravity being 1.8) is contained in the container, and the operation is conducted at 40° for two weeks, it has been confirmed that 10 Kg of the PFC evaporates.

A sealed type container may be used for containing PFC to prevent evaporation of the PFC as a countermeasure. However, the container has to have a structure that sustains pressure variations, and therefore this is not generally practiced.

Also, when a medium other than PFC is used in an apparatus other than a plasma apparatus, the medium needs to be frequently supplemented, and therefore monitoring the quantity of the medium and supplementing the medium require substantial maintenance.

The present invention has been made in view of the problems of the conventional art, and it is an object of the present invention to provide a temperature adjustment apparatus that can reduce evaporation of a medium without using a sealed type container.

DESCRIPTION OF THE INVNETION

The present invention has been made based on the discovery that, when the area of a medium that is in contact with the atmosphere is reduced or a liquid cap is provided between a medium and the atmosphere, evaporation of the medium into the atmosphere can be reduced.

Accordingly, a temperature adjustment apparatus is characterized in comprising: a container that contains a medium for heat exchange and adjusts the temperature of the medium, and a circulation path for the medium that is led out from the container and passes through a subjected member, wherein a liquid layer that separates from the medium is formed over the medium contained in the container to prevent evaporation of the medium into the atmosphere. A liquid cap is present in an upper layer over the medium contained in the container, such that the medium does not directly contact the atmosphere. Accordingly, the rate at which the medium evaporates through the liquid layer into the atmosphere can be reduced. Also, the container does not need to be in a sealed type to prevent evaporation of the medium, such that the need to make the container to sustain pressure variations is eliminated.

A temperature adjustment apparatus can also be is characterized in that a restricted section is provided in an upper portion of the container such that a liquid surface level of the liquid layer is located in the restricted section. The opening area is reduced by the provision of the restricted section in the container such that an area of the medium contacting the atmosphere through the liquid layer can be reduced. As a result, evaporation of the medium into the atmosphere through the liquid layer can be further reduced.

A temperature adjustment apparatus can further be characterized in comprising: a container that contains a medium for heat exchange and adjusts the temperature of the medium, and a circulation path for the medium that is led out from the container and passes through a subjected member, wherein a restricted section is provided in an upper portion of the container such that a liquid surface level of the medium is located in the restricted section. The opening area is reduced by the provision of the restricted section in the container such that an area of the medium contacting the atmosphere can be reduced. As a result, evaporation of the medium into the atmosphere can be further reduced.

A temperature adjustment apparatus can also be characterized in comprising: a container that contains a PFC for heat exchange and adjusts the temperature of the PFC, and a circulation path for the PFC that is led out from the container and passes through a pair of electrodes of a plasma processing apparatus that generates plasma between the pair of electrodes, wherein a liquid layer that separates from the PFC is formed over the PFC contained in the container to prevent evaporation of the PFC into the atmosphere. The temperature control for the electrodes in the plasma apparatus is conducted by using PFC (perfluorocarbon and compounds thereof (HFC) in which part of PFC is replaced with hydrogen). When PFC is used as a medium, the dielectric constant between the electrodes in the plasma apparatus does not change because the insulation resistance value of the PFC is large. As a result, the characteristic of plasma generated between the electrodes can be maintained constant. Furthermore, since a liquid layer is provided in an upper layer of the PEG contained in the container, and the liquid layer is used as a liquid cap, the PEG does not contact the atmosphere. As a result, the PEG is evaporated into the atmosphere through the liquid layer such that the evaporation of the PFC into the atmosphere can be further reduced. Also, the container does not need to be in a sealed type to prevent evaporation of the PFC, such that the need to make the container to sustain pressure variations is eliminated.

A temperature adjustment apparatus can further be characterized in that a restricted section is provided in an upper portion of the container such that a liquid surface level of the liquid layer is located in the restricted section. The opening area is reduced by the provision of the restricted section in the container such that an area of the PFC contacting the atmosphere through the liquid layer can be reduced. As a result, evaporation of the PFC into the atmosphere through the liquid layer can be further reduced.

A temperature adjustment apparatus can also be characterized in that the liquid layer is formed from water. Water separates from PFC, and is readily available. Therefore, water can be readily used as the liquid layer and achieve the prevention of evaporation of the PFC.

A temperature adjustment apparatus can further be characterized in comprising: a container that contains a PFC for heat exchange and adjusts the temperature of the PFC, and a circulation path for the PFC that is led out from the container and passes through a pair of electrodes of a plasma processing apparatus that generates plasma between the pair of electrodes, wherein a restricted section is provided in an upper portion of the container such that a liquid surface level of the PFC is located in the restricted section.

The temperature control for the electrodes in the plasma apparatus is conducted by using PFC (perfluorocarbon and compounds thereof (HFC) in which part of PFC is replaced with hydrogen). When PFC is used as a medium, the dielectric constant between the electrodes in the plasma apparatus does not change because the insulation resistance value of the PFC is large. As a result, the characteristic of plasma generated between the electrodes can be maintained constant. Furthermore, the opening area is reduced by the provision of the restricted section in the container such that an area of the PFC contacting the atmosphere can be reduced. As a result, evaporation of the PFC into the atmosphere can be reduced.

BEST MODE EMBODIMENTS OF THE PRESENT INVENTION

A temperature adjustment apparatus in accordance with a preferred embodiment of the present invention is described below in detail with reference to the accompanying drawings.

Figure 1:
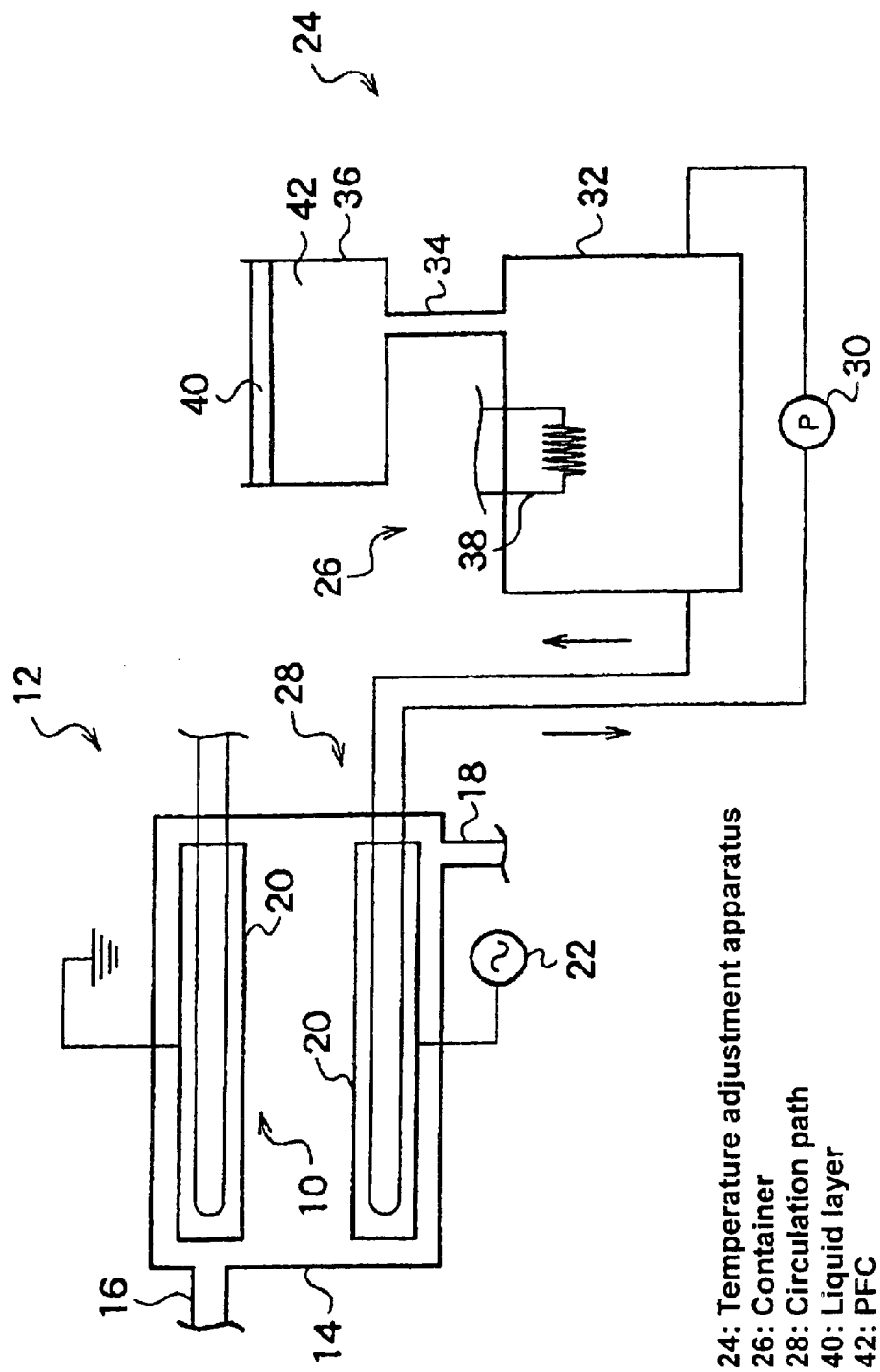
FIG. 1 is an illustration to describe an example in which a temperature adjustment apparatus in accordance with the present invention is applied to a plasma apparatus that performs etching on semiconductor wafers.

FIG. 1 is an illustration to describe an example in which a temperature adjustment apparatus in accordance with the present invention is applied to a plasma apparatus that performs etching on semiconductor wafers.

As shown in the figure, a plasma apparatus 10 is a component of an etching apparatus 12 that performs etchings on semiconductor wafers.

The etching apparatus 12 is formed from a vacuum chamber 14 that is capable of introducing semiconductor wafers and reducing its pressure. A plasma apparatus 10 is disposed within the vacuum chamber 14.

The vacuum chamber 14 is connected to a gas transfer pipe 16 and an exhaust pipe 18, and a vacuum pump (not shown) is provided intermediate the exhaust pipe 18. By operating the vacuum pump, the internal pressure of the vacuum chamber 14 can be reduced to a specified value. On the other hand, a bomb (not shown) is connected to an end section of the gas transfer pipe 16, and etching gas can be introduced into the vacuum chamber 14.

The plasma apparatus 10 disposed within the vacuum chamber 14 is equipped with a pair of plate-shaped parallel electrodes 20. One of the electrodes 20 is connected to a high-frequency power supply 22 that is disposed outside the vacuum chamber 14, and the other of the electrodes 20 provides a grounding potential, such that plasma can be generated between the electrodes 20 by operating the high frequency power supply 22. In accordance with the present embodiment, semiconductor wafers are placed above the electrode 20 that is connected to the high-frequency power supply 22, such that an etching process for the semiconductor wafers can be conducted with plasma generated between the electrodes 20.

It is noted that the pair of electrodes 20 that form the plasma apparatus 10 are equipped with a temperature adjustment apparatus 24 for the purposes of keeping the temperature of the electrodes 20 constant (the resistance value of the electrodes constant) to thereby generate stabilized plasma.

The temperature adjustment apparatus 24 is composed of a container 26 that contains PFC in a liquid form to serve as a medium and maintains the temperature of the PFC at a pre-set temperature, a circulation path 28 that includes a piping that is led out from the container 26 and passes through the electrode 20, and a pump 30 that is provided intermediate to the circulation path 28 to pump out the PFC. It is noted that the temperature adjustment apparatus 24 is mounted on each of the pair of electrodes 20 that form the plasma apparatus 10. However, these temperature adjustment apparatuses 24 have the same structure, and therefore the figure shows only one of the temperature adjustment apparatuses 24 that is connected to the high-frequency power supply 22, and an illustration of the other temperature adjustment apparatus 24 that is connected to the mounted potential side is omitted.

In accordance with the present embodiment, the temperature adjustment apparatus 24 is provided on each of the pair of electrode 20. However, without being limited to this embodiment, temperature adjustment for both of the electrodes 20 may be conducted by one temperature adjustment apparatus 24. Alternatively, since the temperature of the electrode 20 that is connected to the mounted potential side does not elevate compared to the electrode 20 that is connected to the high-frequency power supply 22, the temperature adjustment apparatus 24 may be mounted only on the electrode 20 that is connected to the high-frequency power supply 22.

The container 26 that contains PFC is formed from a main tank 32 that serves as a sealed type container and a reserve tank 36 that is connected to the main tank through a piping 34. The main tank 32 is located below the reserve tank 36, and both ends of the circulation path 28 are connected to the main tank 32. As a result, when PFC is charged through an opening section of the reserve tank 36 until the PFC fills an area adjacent to the opening section, only PFC is present within the main tank 32, and bubbles escape to the reserve tank 36 through the piping 34. Accordingly, since only PFC is introduced in the circulation path 28, the temperature adjustment by the PFC can be stably conducted. It is noted that, even when the amount of PFC is reduced by evaporation or other factors, the PFC is supplied to the main tank 32 from the reserve tank 36 disposed above the main tank 32 through the piping 24, such that the PFC is securely introduced into the circulation path 28.

Also, even when the pressure within the main tank 32 is elevated for some reasons (by a breakdown of the pump 30, for example), the pressure is released from the side of the reserve tank 36 through the piping 34, such that the occurrence of damages to the container 26 is prevented.

In this embodiment, water that has a smaller specific gravity than that of PFC 42 is introduced through the opening section of the reserve tank 36 of the container 26 that is filled with the PFC, and the water forms a liquid layer 40 (in other words, a liquid cap) that separates from the PFC, to thereby prevent the PFC 42 from contacting the atmosphere.

$C_4F_{20}$ is used (GWP is about 6000–8000) as the PFC in the form of liquid that is used as a medium for the temperature adjustment apparatus 24. Also, since PFC generally has a high insulation resistance value (about 1 GΩ), the dielectric constant between the pair of the electrodes 20 does not vary even when the PFC is introduced in the circulation path 28 in a manner to pass through the electrodes 20. As a result, stable plasma can be generated between the electrodes 20.

A cooling apparatus 38 for adjusting temperature of the PFC is provided on the main tank 32. By operating the cooling apparatus 38, the temperature of the PFC can be adjusted to a predetermined temperature of the electrode 20.

A heat insulation material is provided around the circulation path 28 through which the PFC is conducted in areas other than an area that is in contact with the electrode 20, such that temperature change does not affect the PFC that is passing through the circulation path 28. On the other hand, the area along the circulation path 28 that is in contact with the electrode 20 forms a heat exchange section, where an action of heat conduction from the PFC that is set at the predetermined temperature to the electrode 20 takes place, such that the electrode 20 can be set at the predetermined temperature.

An etching process, which is conducted by operating the etching apparatus 12 equipped with the temperature adjusting apparatus 24 thus constructed, is described.

When an etching process is conducted on a semiconductor wafer using the etching apparatus 12, first, the semiconductor wafer is brought in the vacuum chamber 14, then the vacuum pump (not shown) is operated to reduce the pressure within the vacuum chamber 14, and etching gas is introduced through the gas transfer pipe 16, to thereby set the pressure within the vacuum chamber 14 at a predetermined value.

In this manner, after the etching gas is introduced into the vacuum chamber 14 and the pressure therein is set at a predetermined value, etching on the semiconductor wafer is conducted by plasma generated between the electrodes 20 by the operation of the high-frequency power supply 22.

When the etching is conducted, the temperature adjustment apparatus 24 is operated to stabilize the generated plasma to thereby keep the temperature of the electrodes 20 constant. In other words, in the temperature adjustment apparatus 24, the PFC 42 whose temperature is set at a predetermined value by the cooling apparatus 38 is circulated by the pump 30 through the circulation path 28. Heat exchange between the PFC 42 and the electrode 20 takes place at the electrode 20 that is located in the circulation path 28 such that the electrode 20 can be set at a predetermined temperature.

The PFC 42 that sets the temperature of the electrode 20 is not directly exposed to the atmosphere at the reserve tank 36 as described above, and exposed to the atmosphere through the liquid layer 40. As a result, the liquid layer serves as a cap layer for the PFC 42, and therefore the PFC 42 is prevented from directly evaporating into the atmosphere, and the amount of the PFC 42 that is evaporated can be reduced. Furthermore, in accordance with the present embodiment, water is used to form the liquid layer 40. However, without being limited to this embodiment, any other materials that have a smaller specific gravity than that of the PFC 42, that can separate from the PFC 42, and that do not affect the PFC 42 or the atmosphere may be used.

Figure 2:
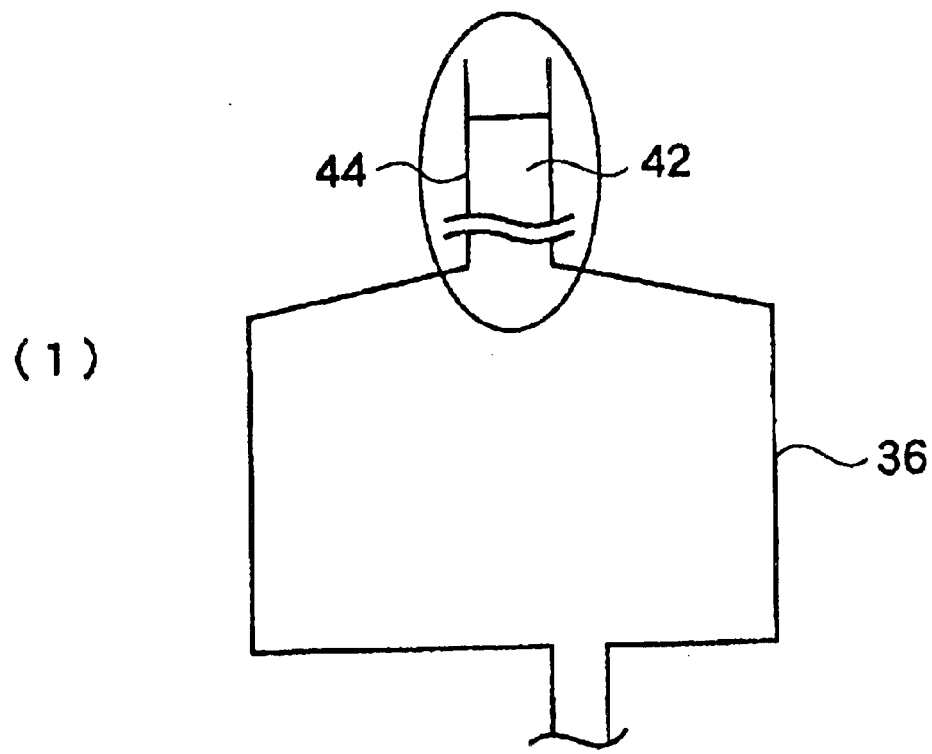
FIG. 2 shows an enlarge view of a main portion of a temperature adjustment apparatus in accordance with another embodiment of the present invention.
Figure 2:
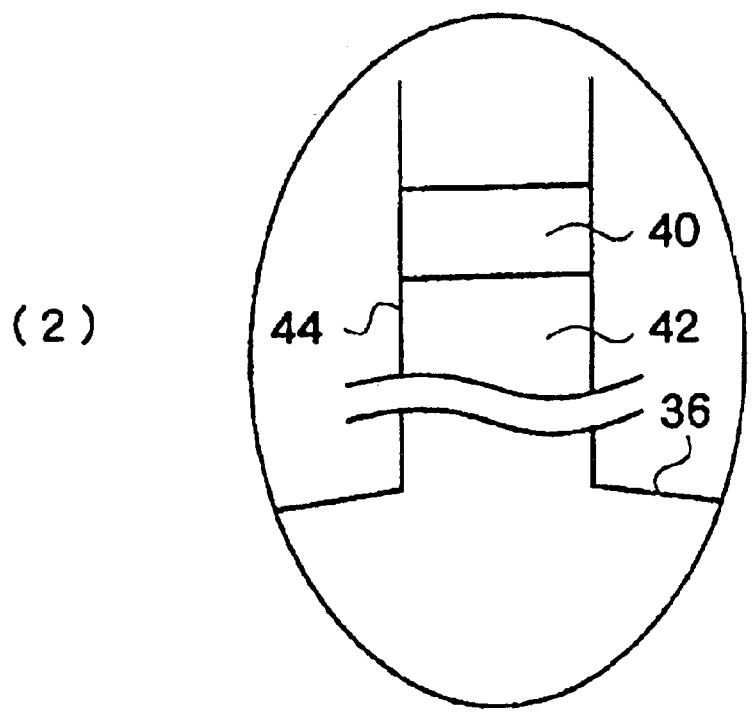

FIG. 2 shows an enlarged view of a main portion of a temperature adjustment apparatus 24 in accordance with another embodiment of the present invention.

As shown in FIG. 2 (1), a restricted section 44 is provided in an upper portion of the reserve tank 36, and a liquid surface height of the PFC 42 is brought up to the restricted section 44.

As the liquid surface height of the PFC 42 is brought up to the restricted section 44, the PFC 42 has a smaller area that is in contact with the atmosphere, such that the amount of the PFC 42 to be evaporated into the atmosphere can be reduced (the amount of evaporation of the PFC 42 is in reverse proportion with respect to the area.)

Furthermore, as shown in FIG. 2 (2), a liquid layer 40 that is composed of water may be provided in an upper layer of the PFC 42, to thereby further reduce the amount of evaporation of the PFC 42. In this case, compared to the embodiment described above with reference to FIG. 1, the amount of water that forms the liquid layer 40 can be reduced.

Figure 3:
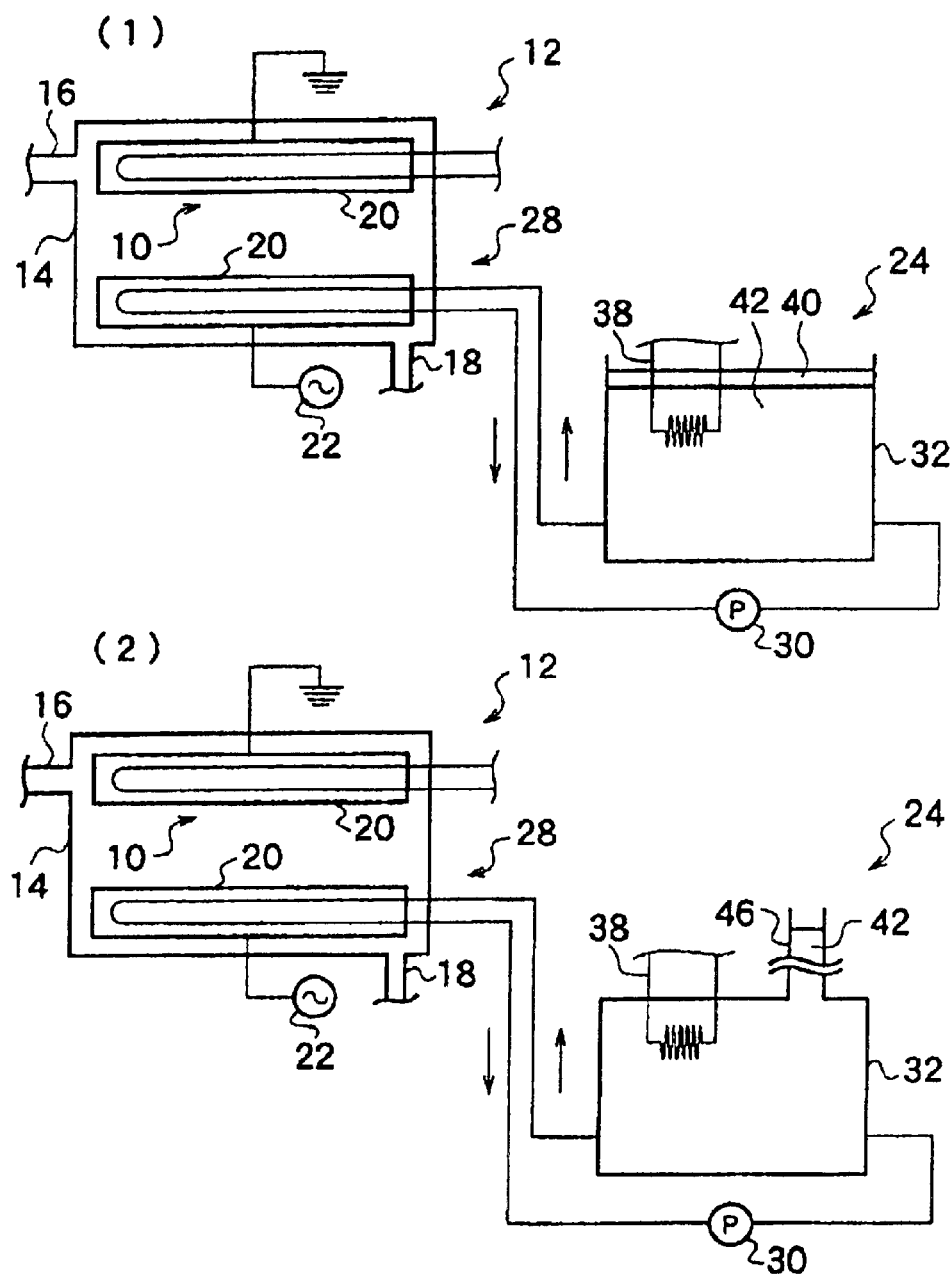
FIG. 3 is an illustration to describe an example embodiment of a temperature adjustment apparatus 24 shown in FIG. 1.

FIG. 3 is an illustration to describe an example embodiment of a temperature adjustment apparatus 24 shown in FIG. 1.

As shown in FIG. 3 (1), the container 26 is composed only of a main tank 32, and the main tank 32 is formed in an open-to-atmosphere type (not a closed type), and a liquid layer 40 can be formed on the surface of the PFC 42 that is filled in the main tank 32. Even in such a configuration, the PFC 42 does not directly contact the atmosphere, and therefore the amount of evaporation of the PFC 42 can be reduced.

Also, as shown in FIG. 3 (2), a restricted section 46 may be provided in an upper section of the main tank 32 and a liquid surface height of the PFC 42 is brought up to the restricted section 46. As a result, the PFC 42 has a smaller area that is in contact with the atmosphere, such that the amount of the PFC 42 to be evaporated into the atmosphere can be reduced (the amount of evaporation of the PFC 42 is in reverse proportion with respect to the area.) It goes without saying that the amount of evaporation of the PFC 42 can be further reduced when a liquid layer 40 that is composed of water is provided in an upper layer of the PFC 42.

What is claimed is:

1. A temperature adjustment apparatus comprising:
a sealed container including a first tank and a second tank disposed above and fluidly communicating with said first tank, said second tank including a base, a sidewall upwardly projecting from said base, and a top enclosing a volume of said second tank, a restricted section that is open to an atmosphere formed on and extending substantially vertically from the top of the second tank, said container configured to adjust a temperature of a heat exchange medium;
said heat exchange medium disposed within said container and filling an entire volume of said first tank and said second tank;
a liquid layer of a different material that is formed over the heat exchange medium to reduce evaporation of the heat exchange medium in to the atmosphere, a surface level of said heat exchange medium being within said restricted section and a liquid surface level of said liquid layer being within said restricted section; and
a circulation path for the heat exchange medium that is led out from the container and passes through a subjected member, said subjected member controlling a temperature of an electrode in a plasma generating apparatus, wherein said second tank is configured to release pressure that builds within said container.

2. The temperature adjustment apparatus according to claim 1, wherein said top of said second tank is angled upwards toward said restricted section.

3. The temperature adjustment apparatus according to claim 1, wherein said restricted section includes a opening that has a smaller diameter than a diameter of said second tank.

4. A temperature adjustment apparatus comprising:
a sealed container including a first tank and a second tank disposed above said first tank, said second tank including a base, a sidewall upwardly projecting from said base, a top enclosing a volume of said second tank, and a nine that is open to an atmosphere and vertically extends from the ton of the second tank, said container configured to adjust a temperature of a PFC;
said PFC used for heat exchange and disposed within said container and filling an entire volume of said first tank and said second tank;
a liquid layer that is formed over said PFC to prevent evaporation of said PFC into the atmosphere, a surface level of said PFC being within said pipe, and a liquid surface level of said liquid layer being within said pipe; and
a circulation path for said PFC that is led out from the container and passes through a pair of electrodes of a plasma processing apparatus that generates plasma between the pair of electrodes,
wherein said PFC adjusts a temperature of said electrodes and said second tank is configured to release pressure that builds within said container.

5. A temperature adjustment apparatus according to claim 4, or claim 5, wherein the liquid layer is formed from water.

6. A temperature adjustment apparatus according to claim 4, wherein the liquid layer is formed from water.

7. The temperature adjustment apparatus according to claim 4, wherein said second tank is configured to release pressure that builds within said container.

8. A temperature adjustment apparatus comprising:
a sealed container including a first tank and a second tank disposed above and fluidly communicating with said first tank, said second tank including a base, a side wall upwardly projecting from said base, a top enclosing a volume of said second tank, and a pipe that is open to an atmosphere formed vertically and extending from the top of the second tank, said container configured to adjust a temperature of temperature controlling medium;
said temperature controlling medium disposed within said container and filling an entire volume of said first tank and said second tank;
a liquid with a specific gravity lower than the temperature controlling medium that is formed over the temperature controlling medium to form a liquid layer that prevents evaporation of the temperature controlling medium into the atmosphere, a surface level of said temperature controlling medium being within said pipe and a liquid surface level of said liquid layer being within said pine; and
a circulation path that carries the temperature controlling medium from the container to a plasma generating apparatus to adjust a temperature of an electrode in said plasma generating apparatus
wherein said second tank is configured to release pressure that builds within said container.

9. A temperature adjustment apparatus according to claim 8, wherein the temperature controlling medium is PFC.

10. A temperature adjustment apparatus according to claim 8, wherein the liquid is water.

11. A plasma generating apparatus comprising:
a first electrode connected to a high-frequency power supply and a second electrode that provides a grounding potential for generating plasma therebetween;
wherein the first electrode and the second electrode each include a temperature adjustment apparatus, each temperature adjustment apparatus comprising:
a container including a first tank and a second tank disposed above and fluidly communicating with said first tank, the second tank including a restricted section that is open to an atmosphere and formed on vertically and extending from upper portion of the second tank, the container contains a medium for heat exchange and a liquid layer formed over the medium to prevent evaporation of the medium into the atmosphere, and the container is configured to adjust a temperature of the medium; and
a circulation path for the medium that is led out from the container and passes through a subjected member, the subjected member controlling a temperature of the electrode,
wherein a liquid surface level of the liquid layer and a surface level of the medium are located in the restricted section, and the second tank is configured to release pressure that builds within the container.

12. The plasma generating apparatus according to claim 11, wherein the medium for heat exchange comprises PFC.

13. The plasma generating apparatus according to claim 11, wherein the liquid layer comprises a liquid with a specific gravity lower than a specific gravity of the medium for heat exchange.

14. The plasma generating apparatus according to claim 11, wherein said restricted section includes a opening that has a smaller diameter than a diameter of said second tank.

15. A temperature adjustment apparatus comprising:
a first tank;
a second tank disposed above said first tank and fluidly communicating with said first tank via a vertically extending connection pipe coupled to a top of said first tank and a bottom of said second tank;

a restricted outlet pipe vertically extending from a top of said second tank, said restricted outlet pipe opening an interior volume of said second tank to an atmosphere;

a heat exchange medium occupying an entire volume of said first tank and the entire interior volume of said second tank with a surface level of said heat exchange medium residing within said restricted outlet pipe;

a liquid layer of a different material resting on top of said heat exchange medium within said restricted outlet pipe; and a circulation path leading from said first tank to a heat exchanger and returning to said first tank.

16. The temperature adjustment apparatus of claim 15, wherein a diameter of said restricted outlet pipe is substantially less than a diameter of said second tank.

17. The temperature adjustment apparatus of claim 15, wherein said top of said second tank angles away from the bottom of said second tank and towards said restricted outlet pipe.

18. The temperature adjustment apparatus of claim 15, wherein said restricted outlet pipe is laterally offset from said connection pipe.

* * * * *